United States Patent [19]

Ussery et al.

[11] Patent Number: 4,926,062
[45] Date of Patent: May 15, 1990

[54] TOUCH CONTROL CIRCUIT FOR ORNAMENTAL LAMPS AND METHOD THEREFORE

[75] Inventors: Wayne L. Ussery, 6320 W. Shaw Butte Dr., Glendale, Ariz. 85304; Leonard Weiss, Milwaukee, Wis.

[73] Assignee: Wayne L. Ussery, Glendale, Ariz.; a part interest

[21] Appl. No.: 230,161

[22] Filed: Aug. 9, 1988

[51] Int. Cl.$^5$ .................. H01H 35/00; H03K 3/17
[52] U.S. Cl. .................. 307/116; 307/265; 307/308
[58] Field of Search .................. 307/116, 265, 308; 328/5; 340/561, 562; 361/181, 179, 203; 331/65; 200/DIG. 1

[56] References Cited

U.S. PATENT DOCUMENTS

| | | | |
|---|---|---|---|
| 3,952,213 | 4/1976 | Fukaya | 307/265 |
| 4,065,715 | 12/1977 | Jaffe et al. | 307/265 X |
| 4,065,721 | 12/1977 | Rabe | 307/265 X |
| 4,119,864 | 10/1978 | Petrizio | 307/116 |
| 4,213,061 | 7/1980 | Conner | 307/116 |
| 4,289,980 | 9/1981 | McLaughlin | 328/5 X |
| 4,352,141 | 9/1982 | Kent | 307/116 X |
| 4,360,737 | 11/1982 | Leopold | 307/116 |

Primary Examiner—Vit W. Miska
Assistant Examiner—Sharon D. Logan
Attorney, Agent, or Firm—Harry M. Weiss

[57] ABSTRACT

The capacitance to ground of a metallic ornament is included in an oscillator. When a person touches the ornament, the period of the oscillator increases. The increased period causes a change of state of a bistable latch. In response to the change of state, a silicon controlled rectifier either provides a path for current through a lamp or prevents a flow of current therethrough. The metallic ornament is preferably a Christmas tree ornament or light.

15 Claims, 1 Drawing Sheet

4,926,062

TOUCH CONTROL CIRCUIT FOR ORNAMENTAL LAMPS AND METHOD THEREFORE

BACKGROUND OF THE INVENTION

1. Field of the Invention

This invention is in the field of lighting control circuits and methods therefore and, more particularly, relates to touch control circuits for ornamental lamps and methods therefore.

2. Description of the Prior Art

Touch control of one or more lamps is typically implemented with a multistate circuit that alters the firing angle of a silicon controlled rectifier. The silicon controlled rectifier is connected in series with the lamps and an AC power source.

The circuit usually includes a capacitor formed by ground and a control element. The capacitor has a value that is altered in response to a person touching the control element. Hence, an initial touch of the control element may, for example, cause the circuit to make a transition from an initial state to a first state. A subsequent touch of the control element causes a transition from the first state to a second state. Transitions to other states may be caused in a similar manner. After a known number of transitions, the circuit is in its initial state.

Since the silicon controlled rectifier has a firing angle that is altered by changing the state of the circuit, the average current through the silicon controlled rectifier is related to the state of the circuit. Therefore, the intensity of light is related to the state of the circuit.

The above described circuit and other touch control circuits of the prior art are implemented in a manner that is complex, expensive, unreliable and unsuited for controlling ornamental lamps, such as those used for lighting a christmas tree. The application and removal of power to christmas tree lamps often requires a person to crawl under the tree to reach an electrical outlet. This often results in needles and ornaments falling off the tree creating a disorderly atmosphere and a possible safety hazard. Hence, there was a need for a simplified circuit for touch control of christmas tree lamps.

SUMMARY OF THE INVENTION

An object of the present invention is to provide an improved touch control circuit and method for ornamental lamps.

It is a further object of this invention to provide an improved touch control circuit and method for ornamental lamps which is of a simple design.

It is a still further object of this invention to provide an improved touch control circuit and method for ornamental lamps of a christmas tree.

It is still another object of this invention to provide a physically compact, touch control circuit and method for ornamental lamps.

According to the present invention, a time constant of a circuit is changed in response to a person touching an electrode. When the circuit is in a first state, the change of the time constant causes the circuit to make a transition from the first state to a second state. When the circuit is in the second state, the change of the time constant causes a transition to the first state. When in the second state, the circuit is operable to cause power to be provided to, for example, ornamental lamps. The present invention provides a circuit that is economical, physically compact and easy to construct.

Other objects, features and advantages of the present invention will be more apparent from the following description of the preferred embodiment and the accompanying drawing.

BRIEF DESCRIPTION OF THE DRAWING

FIG. 2a is a graphical showing of voltage on a capacitor in an oscillator in the embodiment of FIG. 1;

FIG. 2b is a graphical showing of a control voltage applied to an analog switch of the oscillator;

FIG. 2c is a graphical showing of the voltage on a reference capacitor in the embodiment of FIG. 1; and FIG. 2d is a graphical showing of the voltage at the output of a flip-flop in the embodiment of FIG. 1.

DESCRIPTION OF THE PREFERRED EMBODIMENT

Figure 1:
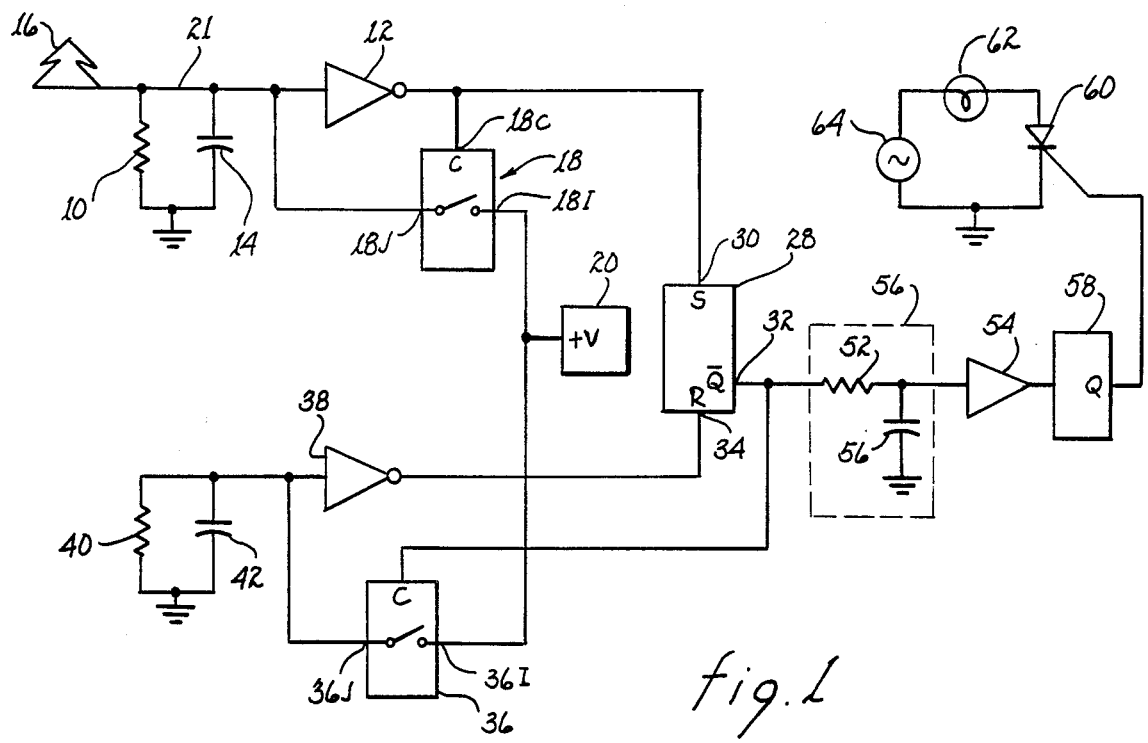
FIG. 1 is a schematic block diagram of the preferred embodiment of the present invention.

Referring to FIG. 1, a resistor 10 is connected between ground and the input of an invertor 12. A capacitor 14 is connected in parallel with resistor 10. In addition to being connected to invertor 12, resistor 10 and capacitor 14 are connected to a metallic ornament 16 of a type that is used to decorate a christmas tree. Since ornament 16 is metallic, it is functionally an electrode.

As explained hereinafter, capacitor 14, resistor 10 and the capacitance to ground of ornament 16 are elements of an oscillator. Moreover, an oscillator time constant, equal to the product of the value of resistor 10 and the sum of the values of capacitor 14 and the capacitance to ground, is directly related to the period of the oscillator. It should be understood that the capacitance to ground is increased when a person touches ornament 16, thereby increasing the period of the oscillator.

The output of invertor 12 is connected to an analog switch 18 at a control input 18C thereof. A signal input 18I of switch 18 is connected to a positive voltage source 20. A signal output 18J of switch 18 is connected to the ungrounded end of resistor 10, whereby resistor 10, the input of inverter 12, capacitor 14 and ornament 16 form a junction bus 21.

When the voltage at the input of inverter 12 is less than an inverter threshold voltage, inverter 12 provides a '1' signal to control input 18C. In response to the '1' signal, switch 18 closes, thereby providing a path of conduction from source 20 to bus 21 to cause the source 20 voltage to be impressed upon bus 21. Hence, capacitor 14 and the capacitance to ground are almost instantaneously charged to the source 20 voltage.

In this embodiment, the source 20 voltage is greater than the inverter threshold voltage. Therefore, when capacitor 14 and the capacitance to ground are charged to the source 20 voltage, inverter 12 provides a '0' signal, thereby causing switch 18 to open and enabling a discharge of capacitor 14 and the capacitance to ground through resistor 10.

Figure 2:
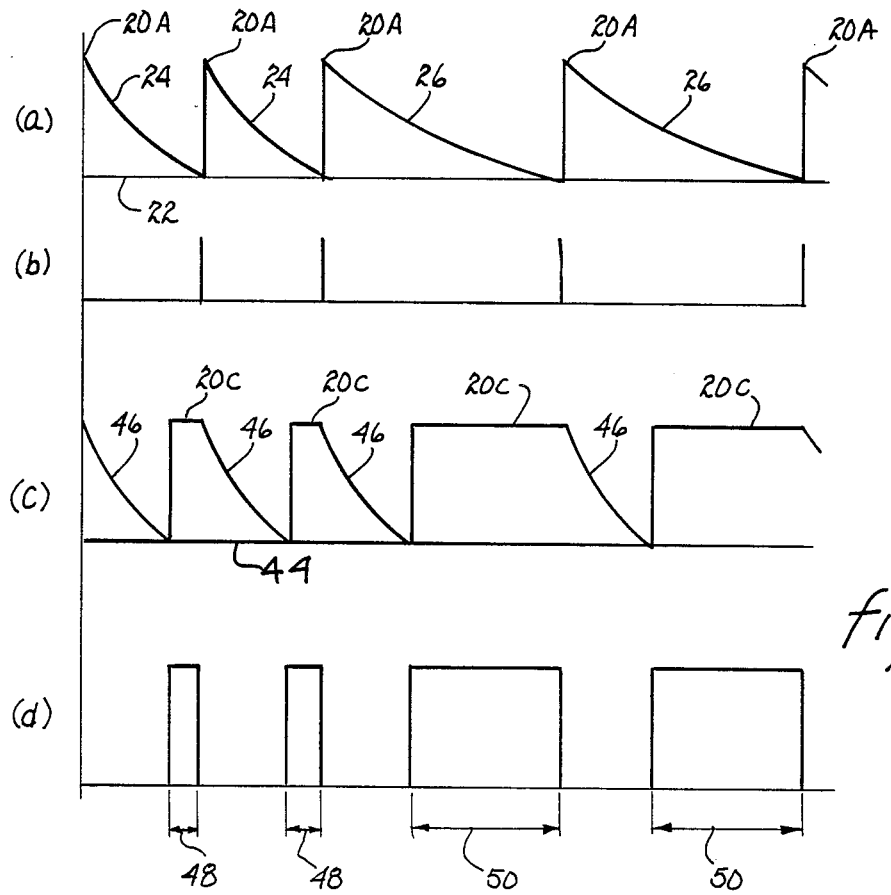
FIG. 2 is a timing diagram of signals in the embodiment of FIG. 1, all on the same time base, where.

Referring to FIG. 2a, the inverter threshold voltage is represented by an abscissa 22. Capacitor 14 and the capacitance to ground are charged to a peak voltage 20A that substantially equals the source 20 voltage. Whenever the voltage on capacitor 14 and the capacitance to ground is greater than the inverter threshold voltage, the discharge through resistor 10 is enabled. Therefore, there is an iterative charging of capacitor 14 and the capacitance to ground to the source 20 voltage and a discharging thereof to a voltage slightly less than the inverter threshold voltage. Hence, resistor 10, inverter 12, capacitor 14 and the capacitance to ground switch 18 and source 20 form the oscillator referred to hereinbefore.

As shown in FIG. 2b, a '1' signal of short duration is applied to control input 18C. The duration is short because when a voltage greater than the inverter threshold voltage is applied to the input of inverter 12, a '0' signal is provided at the output of inverter 12, thereby causing switch 18 to open and enable the discharge of capacitor 14 and the capacitance to ground. Because of inherent transition time delays through inverter 12 and switch 18, capacitor 14 and the capacitance to ground are charged to the source 20 voltage during the short interval.

Since a person touching ornament 16 causes an increase of the capacitance to ground, it correspondingly causes a increase of the oscillator time constant. Portions 24 (FIG. 2a) are representative of the voltage on capacitor 14 when a person is not touching ornament 16. The duration of each of portions 24 is directly related to the oscillator time constant when the person is not touching ornament 16. Similarly, portions 26 are representative of the voltage on capacitor 14 when the person touches ornament 16. The duration of each of portions 26 is directly related to the oscillator time constant when the person touches ornament 16. The duration of portions 26 is greater than the duration of portions 24. Thus, portions 24 and 26 graphically show that when the person touches ornament 16, the period of the oscillator is increased as explained hereinbefore.

The output of inverter 12 is additionally connected to a flip flop 28 at a set input 30 thereof. In response to inverter 12 providing the '1' signal (FIG. 2b), a complementary output 32 of flip flop 28 provides a '0' signal which persists until a '1' signal is provided at a reset input 34 of flip flop 28 and a '0' signal is provided by inverter 12.

Output 32 is connected to an analog switch 36 at a control input C thereof. Switch 36 is similar to switch 18 described hereinbefore. A signal input 36I of switch 36 is connected to source 20. A signal output 36J of switch 36 is connected to source 20. A signal output 36J of switch 36 is connected to a inverter 38 at the input thereof. Inverter 38 is similar to inverter 12.

The input of inverter 38 is connected to ground through a resistor 40. A capacitor 42 is connected in parallel with resistor 40. In this embodiment, a reference time constant equals the product of the values of resistor 40 and capacitor 42. Moreover, the oscillator time constant is always greater than the reference time constant.

As shown in FIG. 2c, the inverter threshold voltage is represented by an abscissa 44. Additionally, the source 20 voltage is represented by portions 20c. When output 32 from flip flop 28 provides a '0' signal, capacitor 42 discharges to a voltage slightly less than the inverter threshold voltage to cause inverter 38 to provide a '1' signal to reset input 34. Because of the '1' signal at reset input 34, a '1' signal is provided at output 32 thereby causing switch 36 to close; the closure provides a path of conduction from source 20 to the input of inverter 38 and capacitor 42, whereby capacitor 42 charges to the source 20 voltage.

Portions 46 are representative of the voltage on capacitor 42 during its discharge. The duration of each of portions 46 is a reference period that is directly related to the reference time constant. In this embodiment, the reference time constant does not vary. Since the oscillator time constant is always greater than the reference time constant, the reference period is always of shorter duration than portions 24 and 26 (the oscillator period).

From the description given hereinbefore, a '1' signal at output 32 is initiated at a time, substantially equal to the reference period, after a '1' signal is provided by inverter 12. As shown in FIG. 2a, c and d, at output 32 (FIG. 2d), a '1' signal at output 32 has a duration 48 or 50 that substantially equal the respective differences between the oscillator and reference periods when the person does not touch ornament 16 and when the person touches ornament 16. Moreover, when the '1' signal at output 32 has duration 48, it has a reduced duty cycle. Correspondingly, when the '1' signal at output 32 has duration 50, it has an increased duty cycle. Therefore, output 32 provides a digital signal having a duty cycle that changes when a person touches ornament 16.

Output 32 (FIG. 1) is additionally connected through a resistor 52 to the input of a buffer 54. The input of buffer 54 is additionally connected to ground through a capacitor 56. As known to those skilled in the art, resistor 52 and capacitor 56 comprise a low pass filter 56, with its input connected to output 32 and its output connected to the input of buffer 54. Because of filter 56, the input to buffer 54 is substantially a DC signal having an amplitude proportional to the duty cycle.

The output of filter 56 equals the average voltage at output 32 and is in accordance with a relationship which is given as:

$$V_o = V_c \frac{T_1 - T_2}{T_1}$$

where:

$V_0$ is the output voltage of filter 56;
$V_c$ is the voltage amplitude of a '1' signal;
$T_1$ is the oscillator period; and
$T_2$ is the reference period.

When the duty cycle has the reduced value, filter 56 provides a DC voltage having an amplitude that is less than a buffer threshold voltage of buffer 54, thereby causing buffer 54 to provide a '0' signal at its output. Correspondingly, when the duty cycle has the increased value, filter 56 provides a DC voltage that is greater than the buffer threshold voltage, thereby causing buffer 54 to provide a '1' signal.

The output of buffer 54 is connected to the input of a bistable latch 58 at the input thereof. Latch 58 is a device that has two states. When latch 58 is in a first state, it makes a transition to a second state in response to the output of a buffer 54 changing from a '0' signal to a '1' signal. Similarly, when latch 58 is in the second state, it makes a transition to the first state in response to the output of buffer 54 changing from a '1' signal to a '0' signal. Therefore, latch 58 changes from either the first state to the second state or vice versa in response to the person touching ornament 16.

The output of latch 58 is connected to a silicon controlled rectifier 60 (hereinafter referred to as SCR 60) at the gate thereof. The cathode of SCR 60 is connected to one terminal of a lamp 62. The other terminal of lamp 62 is connected to a voltage source 64 that provides an AC voltage with respect to ground. Therefore SCR 60, lamp 62 and source 64 are all connected in series.

When latch 58 is in the second state, a positive voltage is provided to the gate of SCR 60. In response to the positive voltage, SCR 60 conducts positive half cycles of current provided by source 64. Since SCR 60, lamp 62 and source 64 are in series, the half cycles of current cause illumination of lamp 62. When latch 58 is in the first state, substantially zero volts is provided to the gate of SCR 60. In response to zero volts, SCR 60 is substantially non conductive, thereby preventing a flow of current through lamp 62. It should be understood that in an alternative embodiment (not shown), a plurality of lamps may be included in series with SCR 60 and source 64.

The above description is of the preferred embodiment of the invention and is not a limitation of the scope of the invention. Many variations of the preferred embodiment will be apparent to those skilled in the art that would be encompassed by the spirit and scope of the invention.

We claim:

1. A touch control circuit for at least one lamp wherein capacitance to ground of an electrode is increased in response to a person touching said electrode, comprising:
   oscillator means connected to said electrode having a period directly related to said capacitance;
   means coupled to said oscillator means for generating a digital signal that has a duty cycle directly related to said oscillator period; and
   means coupled to said generating means for providing a current through said at least one lamp in response to an increased value of said duty cycle.

2. The circuit of claim 1 wherein said oscillator means comprises:
   a resistor connected in parallel with said capacitance;
   an inverter having its input connected to said resistor and to said electrode, said inverter providing a '1' signal in response to an input voltage that is less than a threshold voltage; and
   means connected to the output of said inverter for charging said capacitance to a known voltage that is greater than said threshold voltage in response to said inverter providing a '1' signal.

3. The circuit of claim 2 wherein said means for charging comprises:
   an analog switch having a control input connected to the output of said inverter; and
   a source of said known voltage connected to a signal input of said switch, a signal output of said switch being connected to the input of said inverter, said switch providing a path of conduction from said source to the input of said inverter in response to said inverter providing a '1' signal.

4. The circuit of claim 2 wherein said means for generating comprises:
   a flip flop having a set input connected to the output of said inverter, said flip flop providing a '0' signal at a complementary output thereof in response to said inverter providing a '1' signal; and
   reference means for providing a '1' signal to a reset input of said flip flop at a time equal to a reference period after said inverter provides a '1' signal, said digital signal being provided at said complementary output.

5. The circuit of claim 4 wherein said reference means comprises:
   an inverter, the output thereof is connected to said reset input;
   a resistor connected between the input of said inverter and ground;
   a capacitor connected in parallel with said resistor; and
   an analog switch having a control input connected to said complementary output, a signal input connected to said source of said known voltage and a signal output connected to the input of said inverter, said switch providing a path of conduction from said source to the input of said inverter in response to said complementary output providing a '1' signal.

6. The circuit of claim 4 wherein the average voltage at said complementary output is in accordance with a relationship which is given as:

$$V_o = V_c \frac{T_1 - T_2}{T_1}$$

where:
   $V_0$ is the average voltage;
   $V_c$ is the voltage amplitude of a '1' signal at said complementary output;
   $T_1$ is the oscillator period; and
   $T_2$ is the reference period.

7. The circuit of claim 4 additionally comprising a low pass filter, the input thereof being connected to said complementary output, said filter providing substantially a DC signal having an amplitude proportional to said duty cycle.

8. The circuit of claim 1 wherein said means for providing includes a bistable latch that changes its state in response to said duty cycle having an increased value.

9. The circuit of claim 7 additionally comprising:
   buffer means connected to said filter for providing a '1' signal in response to said duty cycle having an increased value; and
   a bistable latch that changes its state in response to said buffer means providing a '1' signal.

10. The circuit of claim 8 wherein said means for providing includes a silicon controlled rectifier with its gate connected to said latch, said silicon controlled rectifier being in series with said at least one lamp and an AC power source to provide a path of conduction therethrough in response to said latch being in a known state.

11. The circuit of claim 9, additionally including a silicon controlled rectifier with its gate connected to said latch, said silicon controlled rectifier being in series with said at least one lamp and an AC power source to provide a path of conduction therethrough in response to said latch being in a known state.

12. A method for controlling at least one lighting device having an electrode and a capacitance to ground provided by said electrode comprising the steps of:
   connecting an oscillator to an electrode, said oscillator having a period directly related to said capacitance;
   touching said electrode, thereby generating a digital signal that has a duty cycle directly related to said oscillator period; and
   providing a current through said at least one lighting device in response to an increased value of said duty cycle.

13. A method for controlling at least one lighting device in accordance with claim 12 further comprising the step of changing the state of a bistable latch in response to said increased value of said duty cycle.

14. A method for controlling at least one lighting device in accordance with claim 12 wherein said at least one lighting device is one of a plurality of ornamental christmas tree lights.

15. A method for controlling a lighting device in accordance with claim 12 wherein said electrode is a metal christmas tree ornament.

* * * * *